United States Patent
Shuto (10) Patent No.: US 7,289,365 B2
(45) Date of Patent: Oct. 30, 2007

(54) NONVOLATILE SEMICONDUCTOR MEMORY DEVICE IN WHICH WRITE AND ERASE THRESHOLD VOLTAGES ARE SET AT LEVELS SYMMETRICAL ABOUT NEUTRAL THRESHOLD VOLTAGE OF CELL TRANSISTOR

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 11/244,287

(22) Filed: Oct. 6, 2005

(65) Prior Publication Data

US 2007/0014183 A1    Jan. 18, 2007

(30) Foreign Application Priority Data

Jul. 14, 2005 (JP) .............................. 2005-205870

(51) Int. Cl.
*G11C 8/00* (2006.01)
(52) U.S. Cl. .............................. 365/185.14; 365/185.2; 365/185.23; 365/230.06; 365/225.5
(58) Field of Classification Search ........... 365/230.06, 365/225.7, 185.14, 185.2, 185.23, 225.5
See application file for complete search history.

(56) References Cited

U.S. PATENT DOCUMENTS 6,950,356 B2 *  9/2005  Tao .............................. 365/201

FOREIGN PATENT DOCUMENTS

JP    7-73688    3/1995

OTHER PUBLICATIONS

U.S. Appl. No. 11/244,287, filed Oct. 6, 2005, Shuto.
U.S. Appl. No. 11/248,303, filed Oct. 13, 2005, Hasegawa et al.
Ton Ditewig, et al., "An Embedded 1.2V-Read Flash Memory Module in a 0.18 μm Logic Process", 2001 IEEE International Solid-State Circuits Conference Digest, Session 2, Non-Volatile Memories, 2.4, Feb. 5, 2001, pp. 34-35, 425.

* cited by examiner

*Primary Examiner*—Anh Phung
*Assistant Examiner*—Pho M. Luu
(74) *Attorney, Agent, or Firm*—Oblon, Spivak, McClelland, Maier & Neustadt, P.C.

(57) ABSTRACT

A semiconductor device includes a memory cell and driver. The memory cell has a cell transistor which has one end of a current path connected to a bit line and stores data by storing charges in a floating gate, and a selector gate transistor which has one end of a current path connected to the other end of the current path of the cell transistor and the other end of the current path connected to a source line. The driver is configured to apply, to the control gate of the cell transistor in read, a potential of the same sign as that of a potential applied to the gate of the selector gate transistor.

19 Claims, 6 Drawing Sheets

NONVOLATILE SEMICONDUCTOR MEMORY DEVICE IN WHICH WRITE AND ERASE THRESHOLD VOLTAGES ARE SET AT LEVELS SYMMETRICAL ABOUT NEUTRAL THRESHOLD VOLTAGE OF CELL TRANSISTOR

CROSS-REFERENCE TO RELATED APPLICATIONS

This application is based upon and claims the benefit of priority from prior Japanese Patent Application No. 2005-205870, filed Jul. 14, 2005, the entire contents of which are incorporated herein by reference.

BACKGROUND OF THE INVENTION

1. Field of the Invention

The present invention relates to a semiconductor device having a memory cell which is made up of one FG (Floating Gate) transistor and one selector gate transistor and, more particularly, to setting of the neutral threshold voltage of a cell transistor, and potentials applied to the cell transistor and selector gate transistor in read in a nonvolatile semiconductor memory device.

2. Description of the Related Art

As one kind of logic-embedded semiconductor memory device of which relatively high-speed read is required, there is proposed a nonvolatile semiconductor memory device having a memory cell which is made up of an FG transistor (cell transistor) and selector gate transistor. A memory cell of this type is described in, e.g., T. Ditewing et al., "An Embedded 1.2V-Read Flash Memory Module in a 0.18 µm Logic Process", 2001 IEEE ISSCC Digest 2.4, pp. 34-35, Feb./2001. In a memory cell described in this reference, the drain of an FG transistor is connected to a bit line, its source is connected to the drain of a selector gate transistor, and the source of the selector gate transistor is connected to a source line. A signal output from a word line driver is supplied to the control gate of the FG transistor and the gate of the selector gate transistor to drive these transistors.

As a nonvolatile semiconductor memory device having a similar memory cell structure, there is known a NAND flash memory disclosed in, e.g., Jpn. Pat. Appln. KOKAI Publication No. H07-073688. The memory cell of the NAND flash memory is made up of a plurality of FG transistors and two selector gate transistors. The current paths of the FG transistors are series-connected, and the selector gate transistors are respectively interposed between the bit line and the drain side of the series-connected FG transistors and between the source line and their source side.

Since no selector gate transistor exists on the drain side in the memory cell described in the above reference, the memory cell is not influenced by the channel resistance of the selector gate transistor on the drain side in read. Hence, the cell current can be set large to read quickly.

On the other hand, a potential applied to an unselected bit line in write must be stopped in the selector gate transistor on the source side so as not to supply any current from the unselected bit line to the source line. For this reason, a stricter leakage current characteristic is required of the selector gate transistor than a NAND transistor, and demands have arisen for a measure against this.

Conventional setting of the neutral threshold voltage of a cell transistor and how to apply a control gate potential in read are as follows.

(1) A typical value of the neutral threshold voltage of a cell transistor is about 1 V.

(2) 0 V is applied to a control gate CG of the cell transistor in read.

(3) Write and erase conditions are set so that the threshold voltage of the cell transistor generally becomes about −2 V for "1" data and about 2 V for "0" data.

In a conventional nonvolatile semiconductor memory device described in the above reference, channel ion implantation is performed in the same step for a cell transistor and selector gate transistor in the manufacture. According to this manufacturing method, if the neutral threshold voltage of the cell transistor is set to about 1 V, the threshold voltage of the selector gate transistor becomes about 0.5 V. In write, a voltage of about 7 V is applied to the source/drain region of the selector gate transistor. When the cell transistor is at the neutral threshold voltage of about 1 V, a leakage current of a non-negligible magnitude may flow from the source line to bit line of the memory cell. The leakage current raises the potential of the bit line from a set value of −7 V, generating a write error.

In order to prevent this, the threshold voltage of the selector gate transistor is desirably set higher (e.g., about 1 V). However, the threshold voltage of the selector gate transistor and the neutral threshold voltage of the cell transistor change upon a change in channel ion implantation. It is important in terms of reduction of load on a negative-potential generation circuit to suppress small leakage of the bit line potential applied to an unselected cell to the source line in write. However, when the threshold voltage of the selector gate transistor is set high, the neutral threshold voltage of the cell transistor also rises, and the following problems may occur.

(a) The erase time becomes long because erase becomes difficult. Alternatively, the erase voltage must be set high because the erase threshold voltage (e.g., −2 V) becomes significantly different from the neutral threshold voltage and a large amount of charges must be injected to erase data to a desired erase threshold voltage.

(b) Since the erase threshold voltage becomes significantly different from the neutral threshold voltage, the high-temperature storage characteristic of erase data degrades. This is because, as described in (a), a larger amount of charges are held in the floating gate of a cell in the erase state, an electric field applied to a tunnel oxide film increases in data retention, and a small leakage current flowing through the tunnel oxide film increases during data retention.

Channel ion implantation may be executed in different steps for a cell transistor and selector gate transistor. However, it is not preferable in terms of complication and micropatterning of the manufacturing process to implant channel ions separately (in two steps).

As described above, in a conventional semiconductor device, it is very difficult to decrease the cell leakage current in write without degrading the erase characteristic and data retention characteristic.

BRIEF SUMMARY OF THE INVENTION

According to an aspect of the present invention, there is provided a semiconductor device comprising a cell transistor which has one end of a current path connected to a bit line and stores data by storing charges in a floating gate, a selector gate transistor which has one end of a current path connected to the other end of the current path of the cell transistor and the other end of the current path connected to a source line, and forms a memory cell together with the cell transistor, and a driver configured to apply, to a control gate of the cell transistor in read, a potential of the same sign as a sign of a potential applied to a gate of the selector gate transistor.

According to another aspect of the present invention, there is provided a semiconductor device comprising a memory cell array in which memory cells are arrayed in a matrix, each of the memory cells comprising a cell transistor which has one end of a current path connected to a bit line and stores data by storing charges in a floating gate, and a selector gate transistor which has one end of a current path connected to the other end of the current path of the cell transistor and the other end of the current path connected to a source line, and forms a memory cell together with the cell transistor, a word line driver which drives a word line in the memory cell array to select a column of the memory cells, a source line driver which sets a potential of a source line in the memory cell array, a first potential generation circuit which supplies a read word line potential to the word line driver, a second potential generation circuit configured to supply a write/erase potential to the word line driver, and a control circuit configured to control the first potential generation circuit, the second potential generation circuit, and the word line driver.

DETAILED DESCRIPTION OF THE INVENTION

First Embodiment

Figure 1:
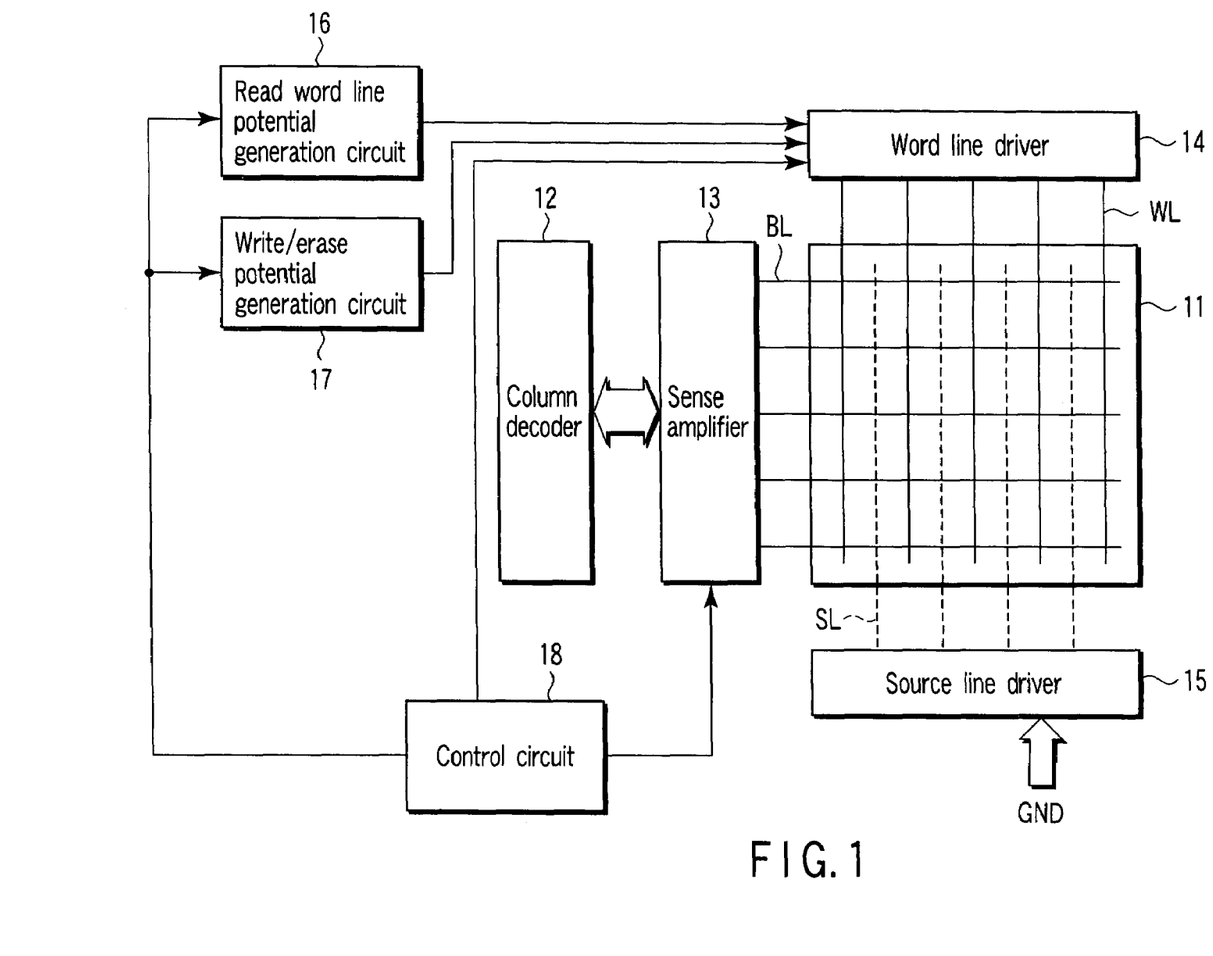
FIG. 1 is a block diagram showing the schematic arrangement of a nonvolatile semiconductor memory device for explaining a semiconductor device according to the first embodiment of the present invention.

FIG. 1 is a block diagram showing the schematic arrangement of a nonvolatile semiconductor memory device for explaining a semiconductor device according to the first embodiment of the present invention. The nonvolatile semiconductor memory device comprises a memory cell array 11, column decoder 12, sense amplifier 13, word line driver 14, source line driver 15, read word line potential generation circuit 16, write/erase potential generation circuit 17, and control circuit 18.

In the memory cell array 11, memory cells are arrayed in a matrix. To select each memory cell, its row is selected by the word line driver 14, and its column is selected by the column decoder 12. The word line driver 14 drives a word line WL, and the source line driver 15 applies a potential to a source line SL. The sense amplifier 13 amplifies the potential of a bit line BL.

The word line driver 14 receives a read word line potential and write/erase potential which are respectively generated by the read word line potential generation circuit 16 and write/erase potential generation circuit 17. The circuits 16 and 17 function as a potential setting circuit for setting a potential to be applied to the control gate of the cell transistor in read. The read word line potential generation circuit 16, write/erase potential generation circuit 17, sense amplifier 13, and word line driver 14 are controlled by the control circuit 18. The source line driver 15 receives the ground potential GND, and applies the ground potential GND to the source line SL.

Figure 2:
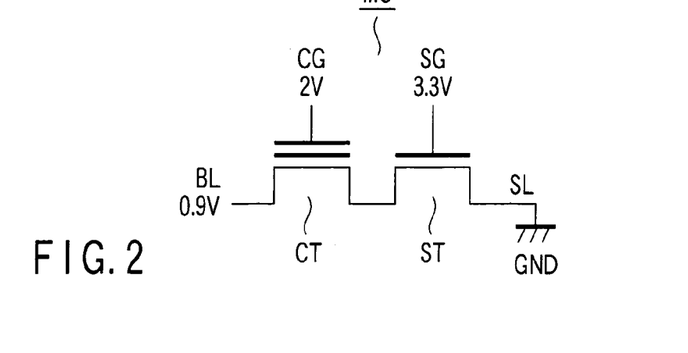
FIG. 2 is a circuit diagram showing each memory cell in a memory cell array in the circuit shown in FIG. 1.

FIG. 2 is a circuit diagram showing each memory cell in the memory cell array 11 in the circuit shown in FIG. 1. A memory cell MC is made up of one FG transistor (cell transistor) CT and one selector gate transistor ST. The drain of the cell transistor CT is connected to the bit line BL, and the control gate CG is connected to the word line driver 14. The drain of the selector gate transistor ST is connected to the source of the cell transistor CT. The source of the selector gate transistor ST is connected to the source line SL (ground potential GND), and its gate is connected to the word line driver 14. A potential shown for each terminal is a potential applied to the terminal in read.

The word line driver 14 comprises a driver/decoder section for the control gate CG of the cell transistor CT, and a driver/decoder section for the gate SG of the selector gate transistor ST. The two driver/decoder sections respectively control the control gate CG of the cell transistor CT and the gate SG of the selector gate transistor ST in accordance with read, write, erase, or the like.

Figure 3:
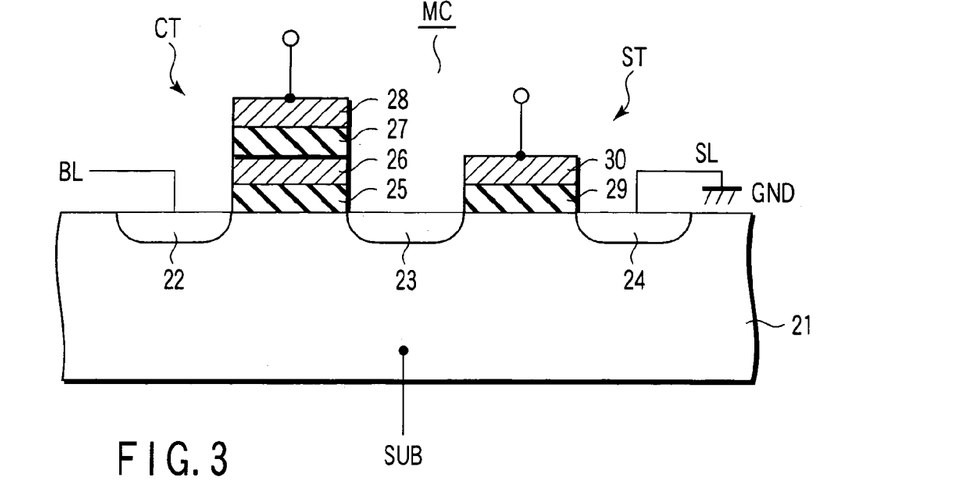
FIG. 3 is a sectional view showing the structure of the memory cell shown in FIG. 2.

FIG. 3 is a sectional view showing the structure of the memory cell MC shown in FIG. 2. An N-type impurity diffusion layer 22 serving as the drain of the cell transistor CT, an N-type impurity diffusion layer 23 serving as the source of the cell transistor CT and the drain of the selector gate transistor ST, and an N-type impurity diffusion layer 24 serving as the source of the selector gate transistor ST are formed on the major surface of a P-type semiconductor substrate (or P-well region) 21 so as to be isolated from each other. The diffusion layer 22 is connected to the bit line BL, and the diffusion layer 24 is connected to the source line SL (ground potential GND).

A floating gate 26 is formed on a first gate insulating film 25 on the major surface of the substrate 21 between the N-type impurity diffusion layers 22 and 23. A control gate 28 (CG) is formed on a second gate insulating film 27 on the floating gate 26, thereby forming the cell transistor CT. The control gate 28 is connected to the driver/decoder section for the control gate CG of the cell transistor CT.

A gate 30 (SG) is formed on a gate insulating film 29 on the major surface of the substrate 21 between the N-type impurity diffusion layers 23 and 24, thereby forming the selector gate transistor ST. The gate 30 is connected to the driver/decoder section for the gate SG of the selector gate transistor ST.

In the arrangement as shown in FIGS. 1 to 3, (A) The threshold voltage of the selector gate transistor ST is set as high as, e.g., about 1 V enough to prevent leakage.

Figure 4A:
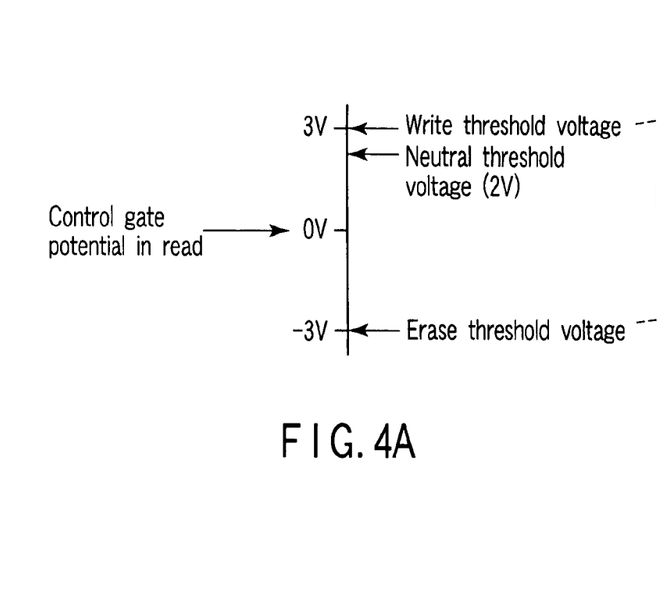
FIGS. 4A and 4B are charts each for explaining a potential setting in read.

(B) The neutral threshold voltage of the cell transistor CT also rises under the influence of (A). That is, when channel ion implantation is performed in the same step for the cell transistor CT and selector gate transistor ST, the impurity concentrations of their channel regions become equal to each other. When the threshold voltage of the selector gate transistor ST is set to 1 V, the neutral threshold voltage of the cell transistor CT becomes, e.g., about 2 V (for coupling=0.5), as shown in FIG. 4A.

Figure 4B:
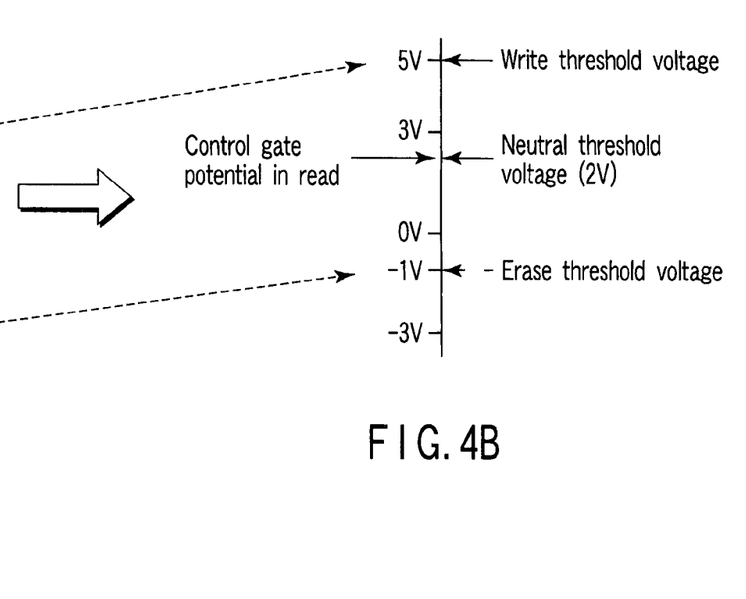

(C) The potential of the control gate CG of the cell transistor CT is set to almost the same value as the neutral threshold voltage of the cell transistor CT (see FIG. 4B) in read.

(D) In accordance with (C), the set values of the write and erase threshold voltages are set to high and low levels symmetrical about the neutral threshold voltage of the cell transistor CT. As is apparent from FIG. 4B, the write and erase threshold voltages are respectively set to 5 V and −1 V by using the neutral threshold voltage "2V" of the cell transistor CT as a center.

In this arrangement, the write and erase threshold voltages become symmetrical about the neutral threshold voltage of the cell transistor. A sufficient margin can be ensured between the write threshold voltage and the neutral threshold voltage of the cell transistor. Even when the neutral threshold voltage must be set high, increases in erase time and erase voltage can be avoided.

For the same reason, degradation of the high-temperature storage characteristic of an erase cell can also be prevented.

According to the prior art, it is difficult to increase the threshold voltage of the selector gate transistor in order to avoid degradation of the erase characteristic and degradation of the high-temperature storage characteristic of an erase cell. According to the technique of the first embodiment, the threshold voltage of the selector gate transistor can be set high without such degradation.

Hence, the cell leakage current in write can be reduced without impairing the erase characteristic and data retention characteristic.

Second Embodiment

Figure 5:
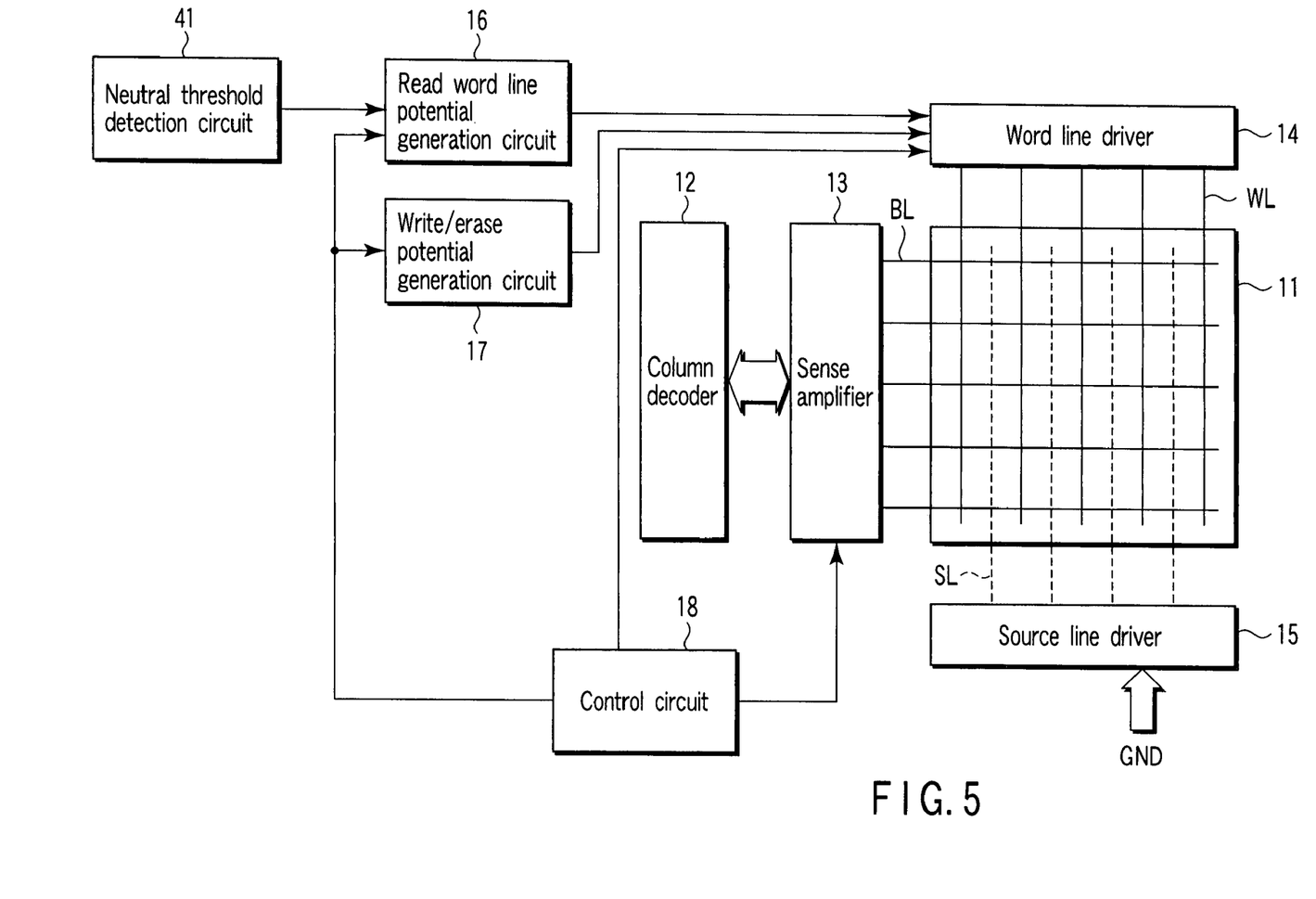
FIG. 5 is a block diagram showing the schematic arrangement of a nonvolatile semiconductor memory device for explaining a semiconductor device according to the second embodiment of the present invention.

FIG. 5 is a block diagram showing the schematic arrangement of a nonvolatile semiconductor memory device for explaining a semiconductor device according to the second embodiment of the present invention. The nonvolatile semiconductor memory device comprises a memory cell array 11, column decoder 12, sense amplifier 13, word line driver 14, source line driver 15, read word line potential generation circuit 16, write/erase potential generation circuit 17, control circuit 18, and neutral threshold detection circuit 41.

The neutral threshold detection circuit 41 detects the neutral threshold of a cell transistor CT, and controls the output potential of the read word line potential generation circuit 16 by using an FG transistor substantially equivalent to the cell transistor CT.

The read word line potential generation circuit 16, write/erase potential generation circuit 17, and neutral threshold detection circuit 41 function as a potential setting circuit for setting a potential to be applied to the control gate of the cell transistor in read.

Figure 6:
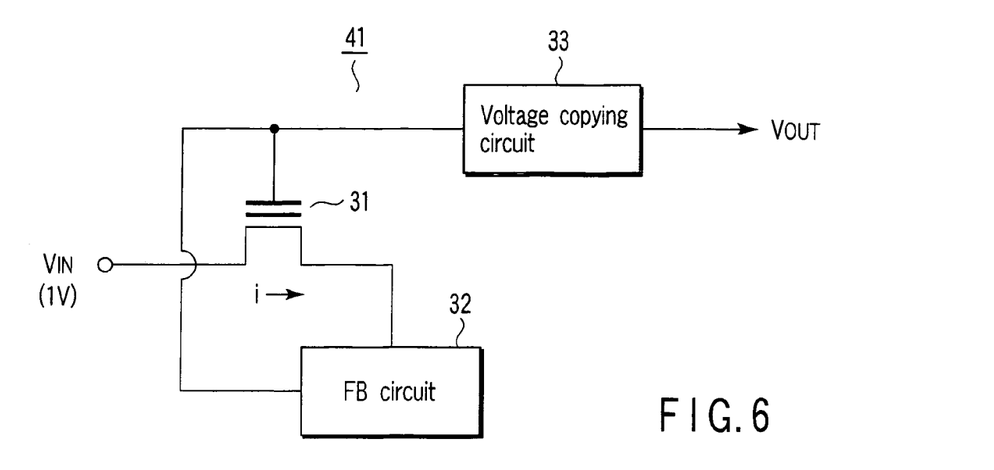
FIG. 6 is a circuit diagram showing an example of the arrangement of a neutral threshold detection circuit in the circuit shown in FIG. 5.

FIG. 6 shows an example of the arrangement of the neutral threshold detection circuit 41 in the circuit shown in FIG. 1. The neutral threshold detection circuit 41 outputs a voltage substantially or almost equal to the neutral threshold voltage of the cell transistor CT. The neutral threshold detection circuit 41 is made up of an FG transistor (dummy transistor) 31 which is identical in pattern and size to the cell transistor CT, an FB circuit 32, and a voltage copying circuit 33.

A voltage $V_{IN}$ of about 1 V is applied to one end of the current path of the FG transistor 31, and the other end is connected to the input terminal of the FB circuit 32. The FG transistor 31 controls the control gate voltage of the FG transistor 31 so that a current of, e.g., $10^{-6}$ A flows through the FG transistor (neutral state). The output terminal of the FB circuit 32 is connected to the control gate of the FG transistor 31 and the input terminal of the voltage copying circuit 33. The output terminal of the voltage copying circuit 33 outputs a voltage $V_{OUT}$ which is substantially equal to the neutral threshold voltage of the cell transistor CT (a small difference in voltage can be permitted and the voltage $V_{OUT}$ suffices to be about the neutral threshold voltage).

When the single FG transistor (dummy transistor) 31 is employed, the characteristic may vary. To prevent this, the current paths of a plurality of, e.g., about 100 FG transistors may be parallel-connected to supply a synthesized current to the FB circuit 32. This arrangement can reduce the influence of variations on the characteristic and achieve high precision.

Third Embodiment

In the nonvolatile semiconductor memory devices according to the first and second embodiments, a potential to be applied to the control gate of a cell transistor in read is determined in advance. However, the neutral threshold voltage of the cell transistor may change from an initially expected value owing to variations in manufacturing process or the like. In this case, setting of the neutral threshold voltage of the cell transistor must be changed.

According to the third embodiment, a potential to be applied to the control gate of a cell transistor in read can be set after the manufacture of a nonvolatile semiconductor memory device.

Figure 7:
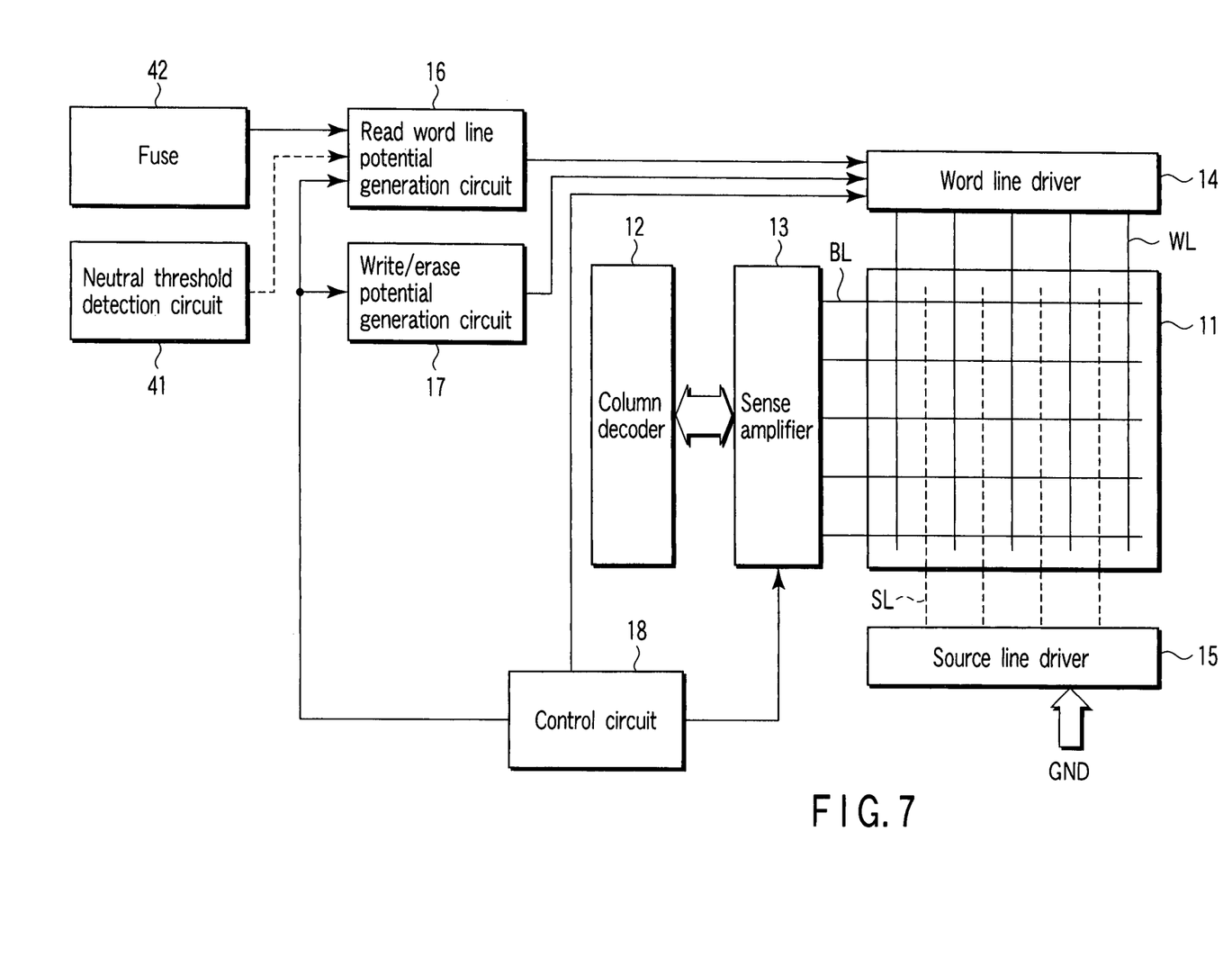
FIG. 7 is a block diagram showing the schematic arrangement of a nonvolatile semiconductor memory device for explaining a semiconductor device according to the third embodiment of the present invention.

FIG. 7 is a block diagram showing the schematic arrangement of a nonvolatile semiconductor memory device for explaining a semiconductor device according to the third embodiment of the present invention. The nonvolatile semiconductor memory device comprises a memory cell array 11, column decoder 12, sense amplifier 13, word line driver 14, source line driver 15, read word line potential generation circuit 16, write/erase potential generation circuit 17, control circuit 18, neutral threshold detection circuit 41, and fuse 42.

Data stored in the fuse 42 is input to the read word line potential generation circuit 16, and the neutral threshold voltage of a cell transistor CT can be changed on the basis of the data.

The read word line potential generation circuit 16, write/erase potential generation circuit 17, and fuse 42 function as a potential setting circuit for setting a potential to be applied to the control gate of the cell transistor in read.

More specifically, the neutral threshold voltage of the cell transistor CT can be measured by a test after the manufacture. For example, a test is conducted after the manufacture, and a potential to be applied to the control gate of the cell transistor CT in read is decided in accordance with the measured value. The decided value (neutral threshold voltage) is stored by, e.g., disconnecting the fuse 42.

The fuse 42 can be implemented by an electric fuse (e.g., a metal fuse or polysilicon fuse), or an antifuse which utilizes dielectric breakdown of a building element of an integrated circuit. The gate oxide film breakdown antifuse utilizes the gate oxide film of a MOSFET as an insulating film to be broken, and can be widely applied to CMOS products because no special additional process is required in a CMOS integrated circuit. Instead of the electric fuse or antifuse, a laser fuse which is irradiated by a laser and fused is also available.

This arrangement can provide a more advanced nonvolatile semiconductor memory device.

A potential to be applied to the control gate of the cell transistor CT in read may also be changed by arranging only the fuse 42 without arranging the neutral threshold detection circuit 41.

Fourth Embodiment

Figure 8:
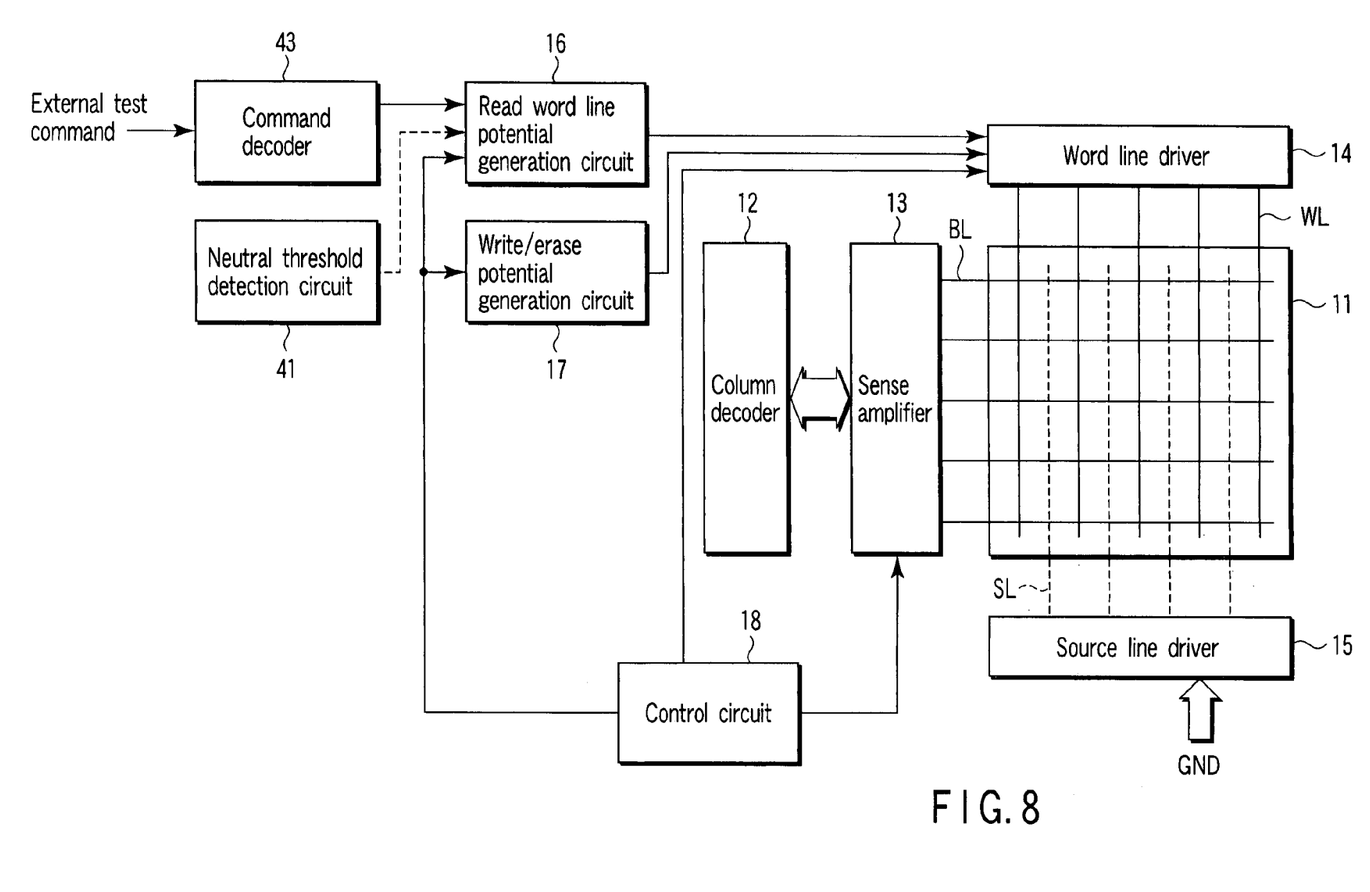
FIG. 8 is a block diagram showing the schematic arrangement of a nonvolatile semiconductor memory device for explaining a semiconductor device according to the fourth embodiment of the present invention.

FIG. 8 is a block diagram showing the schematic arrangement of a nonvolatile semiconductor memory device for explaining a semiconductor device according to the fourth embodiment of the present invention. The nonvolatile semiconductor memory device comprises a memory cell array 11, column decoder 12, sense amplifier 13, word line driver 14, source line driver 15, read word line potential generation circuit 16, write/erase potential generation circuit 17, control circuit 18, neutral threshold detection circuit 41, and command decoder 43.

The read word line potential generation circuit 16 receives a decoding result output from the command decoder 43 which decodes an external test command. The output potential of the read word line potential generation circuit 16 is determined on the basis of the decoding result, and a potential to be applied to the control gate of a cell transistor CT is set to change the neutral threshold voltage.

The read word line potential generation circuit 16, write/erase potential generation circuit 17, and command decoder 43 function as a potential setting circuit for setting a potential to be applied to the control gate of the cell transistor in read.

Since the neutral threshold voltage of the cell transistor CT can be measured by a test after the manufacture, as described above, a potential to be applied to the control gate of the cell transistor CT is set in accordance with the measured value. The set potential can be freely changed by inputting an external test command to the command decoder 43.

A potential to be applied to the control gate of the cell transistor CT in read may also be changed by arranging only the command decoder 43 without arranging the neutral threshold detection circuit 41.

According to the above-described embodiments, in a nonvolatile semiconductor memory device having a memory cell which is made up of one FG transistor and one selector gate, the set values of cell transistor threshold voltages corresponding to "1" data and "0" data are set to values shifted to the positive side in comparison with the prior art. In read, a positive voltage is applied to the control gate of a cell transistor subjected to read, thereby reading out data. The set values of the threshold voltages of the selector gate transistor can be set high to decrease the cell leakage current in write without degrading the data retention characteristic.

Hence, the cell leakage current in write can be reduced without degrading the erase characteristic and data retention characteristic.

As described above, according to one aspect of this invention, a semiconductor device which can reduce the cell leakage current in write without degrading the erase characteristic and data retention characteristic can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a cell transistor which has one end of a current path connected to a bit line and stores data by storing charges in a floating gate;
   a selector gate transistor which has one end of a current path connected to the other end of the current path of the cell transistor and the other end of the current path connected to a source line, and forms a memory cell together with the cell transistor; and
   a driver configured to apply, to a control gate of the cell transistor in read, a potential of the same sign as a sign of a potential applied to a gate of the selector gate transistors,
   wherein the driver includes a word line driver which applies, to the control gate of the cell transistor in read, a potential substantially equal to a neutral threshold voltage of the cell transistor.

2. A device according to claim 1, wherein the cell transistor is of N-channel type, and the word line driver applies a positive potential to the control gate of the cell transistor in read.

3. A device according to claim 1, wherein a write threshold voltage and an erase threshold voltage of the cell transistor are symmetrical about a neutral threshold voltage of the cell transistor.

4. A semiconductor device, comprising:
   a cell transistor which has one end of a current path connected to a bit line and stores data by storing charges in a floating gate;
   a selector gate transistor which has one end of a current path connected to the other end of the current path of the cell transistor and the other end of the current path connected to a source line, and forms a memory cell together with the cell transistor; and
   a driver configured to apply, to a control gate of the cell transistor in read, a potential of the same sign as a sign of a potential applied to a gate of the selector gate transistor;
   wherein the driver further comprises a potential setting circuit configured to set a potential to be applied to the control gate of the cell transistor in read.

5. A device according to claim 4, wherein the potential setting circuit includes a first potential generation circuit configured to supply a read word line potential to a word line driver, and a second potential generation circuit configured to supply a write/erase potential to the word line driver.

6. A device according to claim 5, wherein the potential setting circuit further comprises a fuse which stores a neutral threshold voltage of the cell transistor, and an output potential of the first potential generation circuit is changed on the basis of data set in the fuse.

7. A device according to claim 5, wherein the potential setting circuit further comprises a decoder which decodes an external test command, and an output potential of the first potential generation circuit is changed on the basis of a decoding result of the decoder.

8. A device according to claim 5, wherein a potential setting circuit further comprises a neutral threshold detection circuit which controls an output potential of a first potential generation circuit so as to keep a neutral threshold voltage of the cell transistor constant.

9. A semiconductor device comprising:
a memory cell array in which memory cells are arrayed in a matrix, each of the memory cells comprising a cell transistor which has one end of a current path connected to a bit line and stores data by storing charges in a floating gate, and a selector gate transistor which has one end of a current path connected to the other end of the current path of the cell transistor and the other end of the current path connected to a source line, and forms a memory cell together with the cell transistor;
a word line driver which drives a word line in the memory cell array to select a column of the memory cells;
a source line driver which sets a potential of a source line in the memory cell array;
a first potential generation circuit which supplies a read word line potential to the word line driver;
a second potential generation circuit configured to supply a write/erase potential to the word line driver; and
a control circuit configured to control the first potential generation circuit, the second potential generation circuit, and the word line driver.

10. A device according to claim 9, further comprising a sense amplifier which amplifies a potential of the bit line in the memory cell array, and a column decoder which selects a column of the memory cells.

11. A device according to claim 9, which further comprises a fuse that stores a neutral threshold voltage of the cell transistor, and in which an output potential of the first potential generation circuit is changed on the basis of data set in the fuse.

12. A device according to claim 9, which further comprises a decoder that decodes an external test command, and in which an output potential of the first potential generation circuit is changed on the basis of a decoding result of the decoder.

13. A device according to claim 9, further comprising a neutral threshold detection circuit which controls an output potential of the first potential generation circuit so as to keep a neutral threshold voltage of the cell transistor constant.

14. A device according to claim 9, wherein the neutral threshold detection circuit includes an FB circuit which controls a dummy transistor identical to the cell transistor and a control gate of the dummy transistor, and controls a current flowing through the cell transistor to a predetermined value, and a voltage copying circuit which copies an output voltage of the FB circuit.

15. A device according to claim 9, wherein the neutral threshold detection circuit includes an FB circuit which controls a plurality of dummy transistors having parallel-connected current paths, and control gates of the dummy transistors, and controls a current flowing through the cell transistor to a predetermined value, and a voltage copying circuit which copies an output voltage of the FB circuit.

16. A device according to claim 9, wherein the word line driver applies, to a control gate of the cell transistor in read, a potential substantially equal to a neutral threshold voltage of the cell transistor.

17. A device according to claim 9, wherein a write threshold voltage and an erase threshold voltage of the cell transistor are symmetrical about a neutral threshold voltage of the cell transistor.

18. A device according to claim 9, wherein the cell transistor is of N-channel type, and the word line driver applies a positive potential to a control gate of the cell transistor in read.

19. A device according to claim 9, wherein impurity concentrations of channel regions in the cell transistor and the selector gate transistor are equal to each other.

* * * * *